(12) United States Patent
Huang et al.

(10) Patent No.: US 9,562,937 B2
(45) Date of Patent: Feb. 7, 2017

(54) CIRCUIT AND METHOD FOR SENSING A CAPACITANCE

(71) Applicant: Elan Microelectronics Corporation, Hsinchu (TW)

(72) Inventors: Chun-Chung Huang, Hsinchu (TW); I-Shu Lee, Keelung (TW); Shih-Yuan Hsu, Yunlin County (TW); Te-Sheng Chiu, Taichung (TW)

(73) Assignee: ELAN MICROELECTRONICS CORPORATION, Hsinchu (TW)

( * ) Notice: Subject to any disclaimer, the term of this patent is extended or adjusted under 35 U.S.C. 154(b) by 94 days.

(21) Appl. No.: 14/728,461

(22) Filed: Jun. 2, 2015

(65) Prior Publication Data

US 2015/0260771 A1 Sep. 17, 2015

Related U.S. Application Data

(62) Division of application No. 13/316,273, filed on Dec. 9, 2011, now Pat. No. 9,075,486.

(30) Foreign Application Priority Data

Dec. 10, 2010 (TW) .............................. 099143211 A

(51) Int. Cl.
| | |
|---|---|
| *G01R 27/26* | (2006.01) |
| *G06F 3/041* | (2006.01) |
| *G06F 3/045* | (2006.01) |
| *G06F 3/044* | (2006.01) |
| *G01R 1/30* | (2006.01) |
| *H03F 3/04* | (2006.01) |
| *G01D 5/24* | (2006.01) |

(52) U.S. Cl.
CPC ............. *G01R 27/2605* (2013.01); *G01R 1/30* (2013.01); *G06F 3/044* (2013.01); *H03F 3/04* (2013.01); *G01D 5/24* (2013.01); *H03F 2200/474* (2013.01)

(58) Field of Classification Search
CPC ........ G06F 3/044; G01R 27/2605; G01D 5/24
USPC .................................................. 324/658, 678
See application file for complete search history.

(56) References Cited

U.S. PATENT DOCUMENTS

| | | | |
|---|---|---|---|
| 7,046,017 B1 | 5/2006 | Drost et al. | |
| 7,230,435 B2 | 6/2007 | Kunikiyo et al. | |
| 7,498,822 B2 | 3/2009 | Lee | |
| 8,593,429 B2 | 11/2013 | Wang et al. | |
| 2008/0191778 A1 | 8/2008 | Huang et al. | |
| 2009/0303198 A1 | 12/2009 | Yilmaz et al. | |
| 2011/0267312 A1 | 11/2011 | Lin et al. | |

FOREIGN PATENT DOCUMENTS

| | | |
|---|---|---|
| CN | 101191812 A | 6/2008 |
| CN | 101324798 A | 12/2008 |

(Continued)

*Primary Examiner* — Amy He
(74) *Attorney, Agent, or Firm* — Muncy, Geissler, Olds & Lowe, P.C.

(57) ABSTRACT

A transconductance amplifier mirror circuit is connected to an electrode for sensing the capacitance of the electrode with reference to ground, or the capacitance between the electrode and another electrode. A voltage level change is produced on the electrode connected to the transconductance amplifier mirror circuit to cause the transconductance amplifier mirror circuit to supply charges to or drain charges from a charge calculation circuit. The charge amount variation is converted to a signal for calculating the sensed capacitance.

14 Claims, 17 Drawing Sheets

(56) References Cited

FOREIGN PATENT DOCUMENTS

| | | | |
|---|---|---|---|
| CN | 101907962 | A | 12/2010 |
| JP | 2004-245826 | A | 9/2004 |
| TW | 200835145 | A | 8/2008 |
| TW | 201003081 | A | 1/2010 |

CIRCUIT AND METHOD FOR SENSING A CAPACITANCE

This application is a divisional application of U.S. patent application Ser. No. 13/316,273, filed on Dec. 9, 2011, for which priority is claimed under 35 U.S.C. §120; and this application claims priority of Application No. 099143211 filed in Taiwan on Dec. 10, 2010 under 35 U.S.C. §119, the content of which is incorporated herein by reference in its entirety.

FIELD OF THE INVENTION

The present invention is related to a circuit and method for sensing a capacitance.

BACKGROUND OF THE INVENTION

Conventionally, for sensing a capacitance of a capacitor, the capacitor is first charged to a certain voltage and then shunt to a reference capacitor for charge balance therebetween, by which the amount of charges transferred to the reference capacitor can be used to calculate the capacitance of the sensed capacitor based on the capacitance of the reference capacitor. However, this method requires to wait for a long time before the charge balance process finishes, and is thus applied only to the circuits with slower response speed.

For some applications, there is a need of a circuit and method for sensing a capacitance with faster response speed.

SUMMARY OF THE INVENTION

An objective of the present invention is to provide a circuit and method for sensing a capacitance between two electrodes.

Another objective of the present invention is to provide a circuit and method for sensing a capacitance of an electrode with reference to ground.

According to the present invention, a circuit for sensing a capacitance between two electrodes includes a switching circuit to change the voltage level of the first one of the two electrodes, a transconductance amplifier mirror circuit to detect the voltage variation at the second one of the two electrodes to cause a charge amount variation, and a charge calculation circuit to generate a sensed signal responsive to the charge amount variation.

According to the present invention, a circuit for sensing a capacitance of an electrode with reference to ground includes a switching circuit to change the voltage level of the electrode, a transconductance amplifier mirror circuit to detect the voltage variation at the electrode to cause a charge amount variation, and a charge calculation circuit to generate a sensed signal responsive to the charge amount variation.

According to the present invention, a method for sensing a capacitance between two electrodes includes changing the voltage level of the first one of the two electrodes, maintaining the voltage level of the second one of the two electrodes at a reference voltage to cause a charge amount variation responsive to the voltage variation at the second electrode, and generating a sensed signal responsive to the charge amount variation.

According to the present invention, a method for sensing a capacitance of an electrode with reference to ground includes changing the voltage level of the electrode, maintaining the voltage level of the electrode at a reference voltage to cause a charge amount variation responsive to the voltage variation at the electrode, and generating a sensed signal responsive to the charge amount variation.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
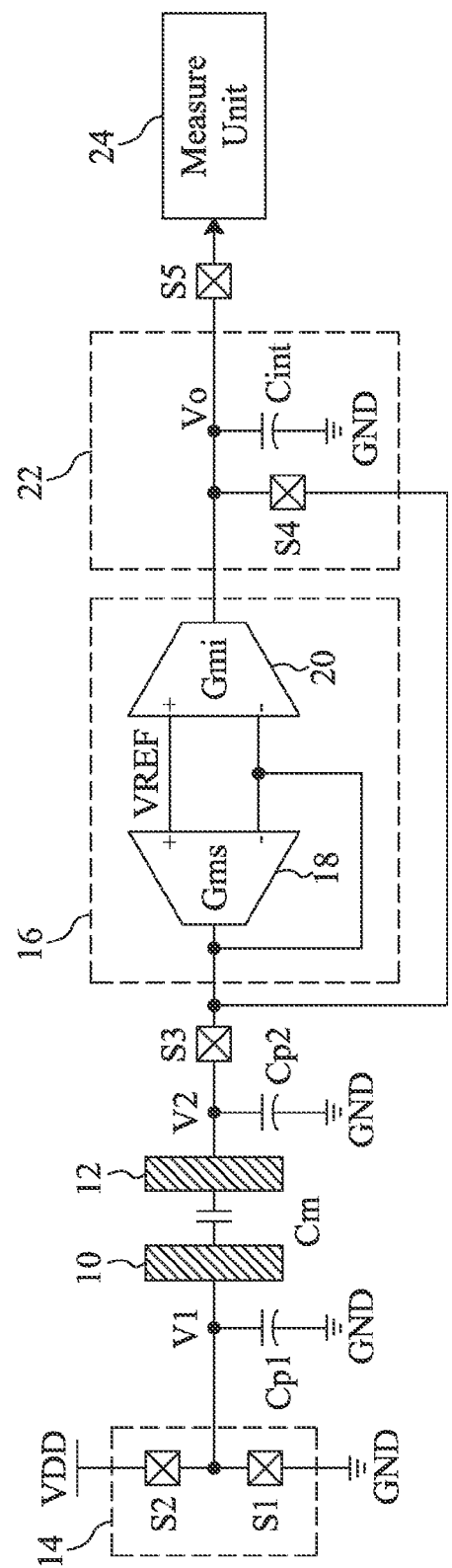
FIG. 1 is a circuit diagram of a first embodiment according to the present invention.

FIG. 1 is a circuit diagram of a first embodiment according to the present invention, in which a circuit for sensing the capacitance Cm between electrodes 10 and 12 includes a switching circuit 14, a transconductance amplifier mirror circuit 16, a charge calculation circuit 22 and a measure unit 24. In this embodiment, the switching circuit 14 includes switches S1 and S2 both connected to the electrode 10 to switch the voltage of the electrode 10 to a higher voltage level or a lower voltage level, for example, a supply voltage VDD and a ground voltage GND as shown in FIG. 1. A sensing switch S3 is connected between the other electrode 12 and the transconductance amplifier mirror circuit 16, controlled to connect the first output port of the transconductance amplifier mirror circuit 16 to the electrode 12. The transconductance amplifier mirror circuit 16 includes two common input transconductance amplifiers 18 and 20, one of the common input ports is applied with a reference voltage VREF that lies between the supply voltage VDD and the ground voltage GND, and the transconductance amplifier 18 has its another common input port connected to its output port that is as the first output port of the transconductance amplifier mirror circuit 16 connected to the sensing switch S3. The transconductance amplifier 20 has its output port as the second output port of the transconductance amplifier mirror circuit 16 connected to the charge calculation circuit 22, and the charge calculation circuit 22 includes a capacitor Cint connected between the output port of the transconductance amplifier 20 and the ground GND, and an initialization switch S4 connected between the output ports of the transconductance amplifiers 18 and 20. To sense the capacitance Cm, the switch S4 is first turned on for a time period to initialize the voltage Vo of the capacitor Cint to the reference voltage VREF. A switch S5 is connected between the charge calculation circuit 22 and the measure unit 24, and during the switch S5 is on, the measure unit 24 may convert the voltage Vo of the capacitor Cint into a digital signal. At the beginning of sensing the capacitance Cm, the voltage V1 of the electrode 10 is changed responsive to the switching of the switches S1 and S2 in the switching circuit 14. When the voltage V1 falls down, the transconductance amplifier mirror circuit 16 will try to maintain the voltage V2 of the electrode 12 at the reference voltage VREF, and thus the transconductance amplifier 18 will supply charges to the electrode 12 responsive to the difference between the voltage V2 and the reference voltage VREF, and responsive to the variation of the voltage V2, the transconductance amplifier 20 also supplies charges to the charge calculation circuit 22. Since the transconductance amplifiers 18 and 20 are in a common input configuration, the amount of charges supplied by the transconductance amplifier 20 to the charge calculation circuit 22 will be proportional to the amount of charges supplied by the transconductance amplifier 18 to the electrode 12. The charge calculation circuit 22 stores the received charges on the capacitor Cint. At the end of sensing the capacitance Cm, the voltage Vo of the capacitor Cint will be related to the capacitance Cm, and the switch S5 is turned on for the measure unit 24 to convert the voltage Vo into a digital signal. Due to connections of hardware circuitry or wire routing on a printed circuit board (PCB), there may be parasitic capacitances Cp1 and Cp2 on the electrodes 10 and 12, respectively that are not possessed by the electrodes 10 and 12 themselves. However, the transconductance amplifier mirror circuit 16 has a feedback mechanism that sets the voltage of the parasitic capacitor Cp2 at the reference voltage VREF before and after sensing the capacitance Cm, thereby preventing the charge calculation circuit 22 from being affected by the parasitic capacitances Cp1 and Cp2.

Figure 2:
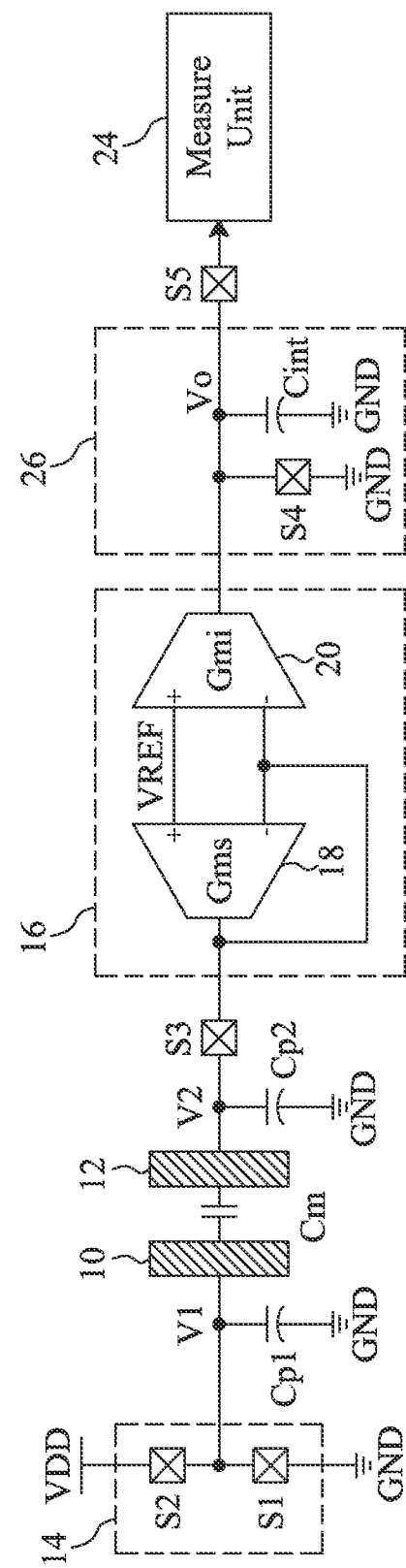
FIG. 2 is a circuit diagram of a second embodiment according to the present invention.

FIG. 2 is a circuit diagram of a second embodiment according to the present invention, whose operational modes and principles are similar to those of the embodiment depicted in FIG. 1. In this embodiment, the initialization switch S4 and the capacitor Cint in the charge calculation circuit 26 are shunt to each other between the output port of the transconductance amplifier 20 and the ground GND. Therefore, when the switch S4 is turned on prior to sensing the capacitance Cm, the voltage Vo of the capacitor Cint is initialized to the ground voltage GND.

Figure 3:
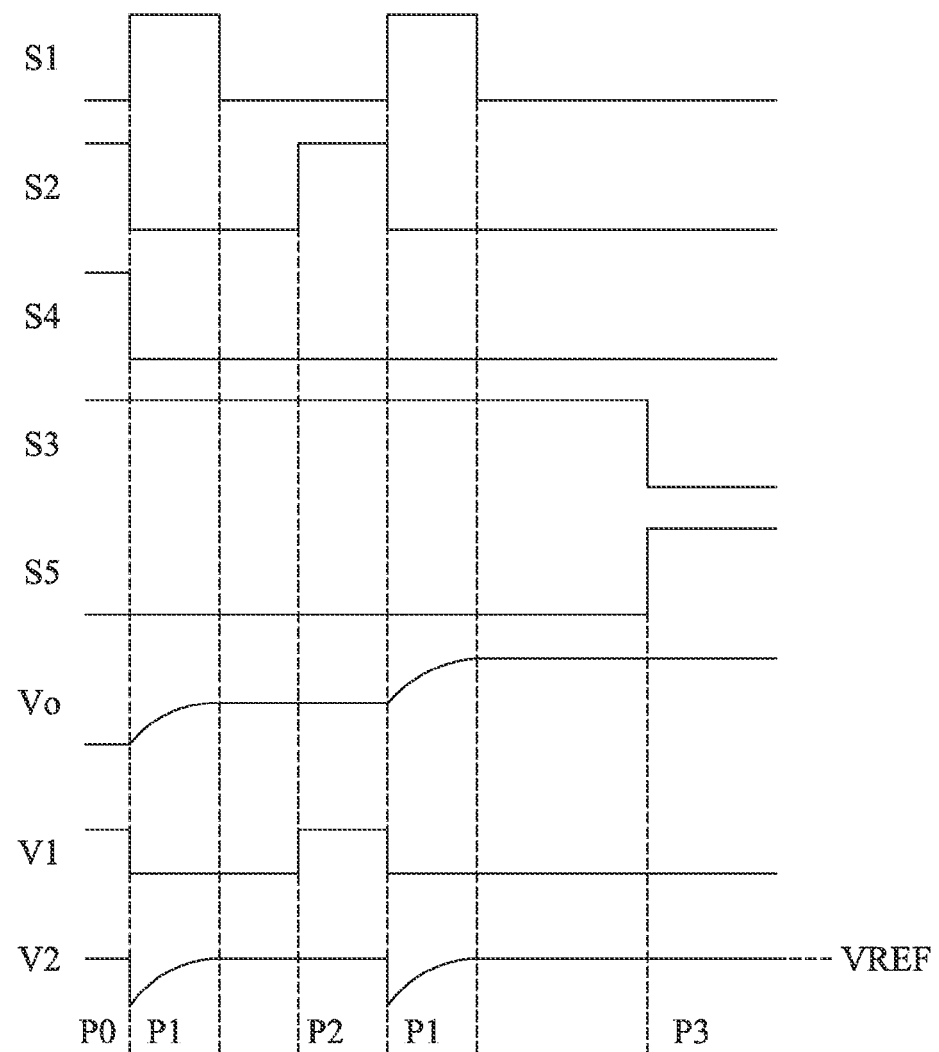
FIG. 3 is a timing diagram for the circuits depicted in FIGS. 1 and 2.

FIG. 3 is a timing diagram for the circuits depicted in FIGS. 1 and 2. The switches S1 and S2 are controlled by two non-overlapping clocks. In the initial phase P0, the switches S2, S3 and S4 are turned on to set the voltage V1 of the electrode 10 to the supply voltage VDD, and the voltage V2 of the electrode 12 to the reference voltage VREF, and initialize the voltage Vo of the capacitor Cint either to the reference voltage VREF as shown in FIG. 1 or to the ground voltage GND as shown in FIG. 2. In the phase P1 that follows, the switch S1 is turned on and thus pulls down the voltage V1 of the electrode 10 to the ground voltage GND, resulting in the voltage V2 of the electrode 12 decreasing along with the voltage V1, causing the capacitor Cm undergoing a charge amount variation $$Q=(VDD-GND) \times Cm. \qquad [\text{Eq-1}]$$

As soon as the transconductance amplifier mirror circuit 16 detects the decrease in the voltage V2, the transconductance amplifier 18 supplies charges to the capacitor Cm to sustain the voltage V2 at the reference voltage VREF, and responsive thereto, the transconductance amplifier 20 also supplies a proportional amount of charges to the capacitor Cint. If the transconductance Gms of the transconductance amplifier 18 is equal to the transconductance Gmi of the transconductance amplifier 20, the amount of charges Q supplied from the transconductance amplifier 20 to the capacitor Cint will also be equal to (VDD−GND)×Cm. The phase P1 may be carried out by only once, or once more again after a phase P2, in which the switch S2 is turned on to pull the voltage V1 back to the supply voltage VDD, and the voltage V2 will be still maintained at the reference voltage VREF, in order to change the voltage V2 to charge the capacitor Cint for a second time. If this process is repeated for many times, the capacitor Cint will be charged for many times and undergo a stepwise variation of the voltage Vo. In the final phase P3, the switch S5 is turned on for the measure unit 24 to measure the variation of the voltage Vo. From the well known equation Q=CV, it can be obtained that the amount of charges Q supplied from the transconductance amplifier 20 to the capacitor Cint is either (Vo−VREF)×Cint for the embodiment of FIG. 1 or (Vo−GND)×Cint for the embodiment of FIG. 2. By substituting either Q=(Vo−VREF)×Cint or Q=(Vo−GND)×Cint into the equation Eq-1, the capacitance Cm can be calculated therefrom. In different embodiments with Gms:Gmi=m:n, each time the amount of charges Q supplied to the capacitor Cint will be (m/n)×(VDD-GND)×Cm.

Figure 4:
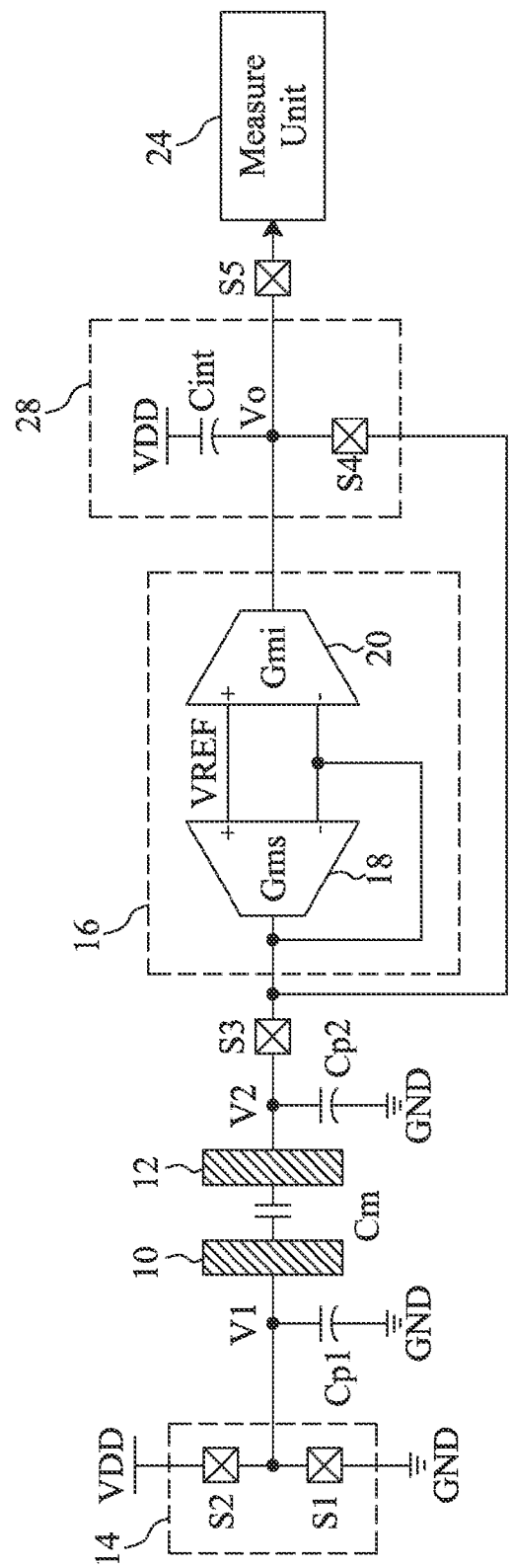
FIG. 4 is a circuit diagram of a third embodiment according to the present invention.

FIG. 4 is a circuit diagram of a third embodiment according to the present invention, which has the same circuit as that of FIG. 1 except that the capacitor Cint in the charge calculation circuit 28 is connected between the output port of the transconductance amplifier 20 and the voltage source VDD. Prior to sensing the capacitance Cm, the initialization switch S4 is turned on to initialize the voltage Vo of the capacitor Cint to the reference voltage VREF. At the beginning of sensing the capacitance Cm, the voltage V1 of the electrode 10 changes responsive to the switching of the switches S1 and S2 in the switching circuit 14. When the voltage V1 is pulled high, in order to sustain the voltage V2 at the reference voltage VREF, the transconductance amplifier 18 will drain charges from the electrode 12 responsive to the difference between the voltage V2 and the reference voltage VREF, and the transconductance amplifier 20 will also drain a proportional amount of charges from the charge calculation circuit 28 responsive to the variation of the voltage V2, thereby changing the amount of charges on the capacitor Cint. At the end of sensing the capacitance Cm, the switch S5 is turned on, so that the voltage Vo of the capacitor Cint will be the sensed signal related to the capacitance Cm. The sensed signal Vo is then converted by the downstream measure unit 24 into a digital signal.

Figure 5:
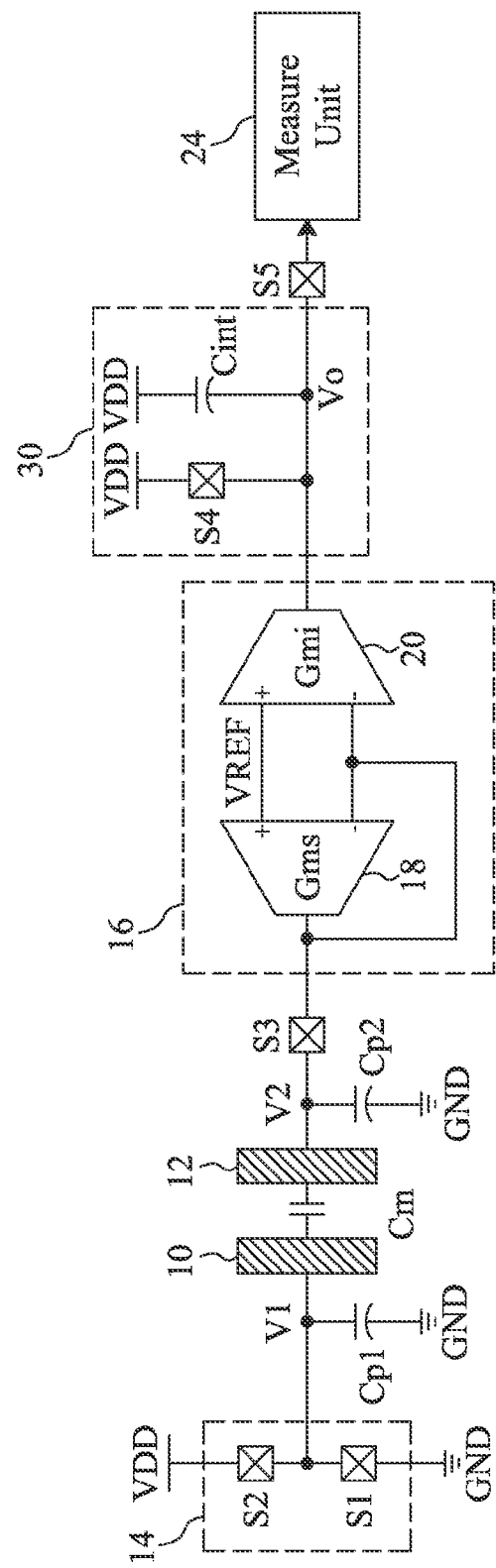
FIG. 5 is a circuit diagram of a fourth embodiment according to the present invention.

FIG. 5 is a circuit diagram of a fourth embodiment according to the present invention, which has the same circuit of FIG. 4 except that the initialization switch S4 is shunt to the capacitor Cint between the voltage source VDD and the output port of the transconductance amplifier 20. Therefore, turn-on of the switch S4 before sensing the capacitance Cm will initialize the voltage Vo of the capacitor Cint to the supply voltage VDD.

Figure 6:
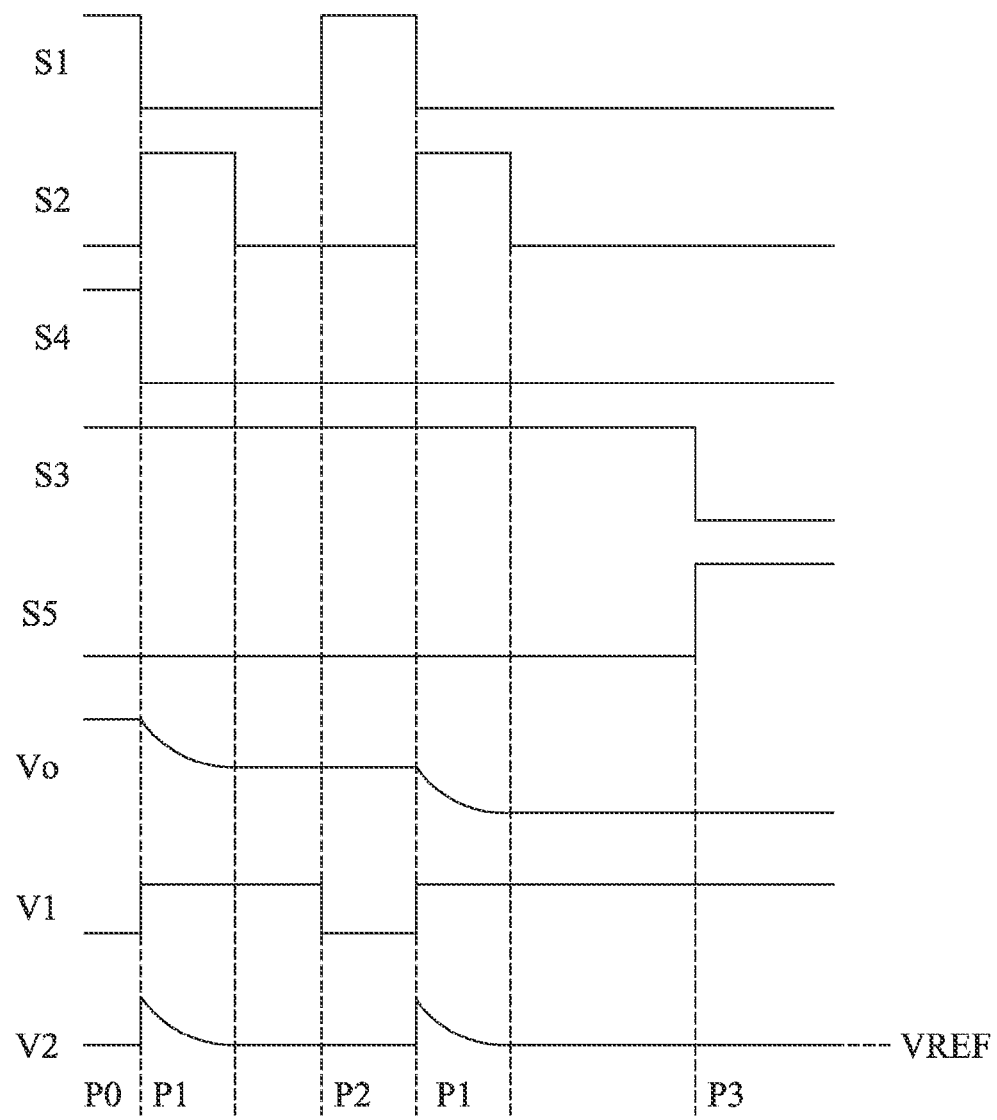
FIG. 6 is a timing diagram for the circuits depicted in FIGS. 4 and 5.

FIG. 6 is a timing diagram for the circuits depicted in FIGS. 4 and 5. The switches S1 and S2 are controlled by two non-overlapping clocks. In the phase P0 for initialization, the switches S1, S3 and S4 are turned on to set the voltage V1 of the electrode 10 to the ground voltage GND, and the voltage V2 of the electrode 12 to the reference voltage VREF, and initialize the voltage Vo of the capacitor Cint either to the reference voltage VREF as shown in FIG. 4 or to the supply voltage VDD as shown in FIG. 5. In the phase P1 that follows, the switch S2 is turned on to pull high the voltage V1 to the supply voltage VDD, causing the voltage V2 of the electrode 12 to increase along with the voltage V1 of the electrode 10. As soon as the transconductance amplifier mirror circuit 16 detects the increase in the voltage V2, the transconductance amplifier 18 will drain charges from the electrode 12 to pull the voltage V2 back to the reference voltage VREF, and thus the transconductance amplifier 20 will drain a proportional amount of charges from the capacitor Cint, where the proportionality is determined by the ratio of the transconductance values between the transconductance amplifiers 18 and 20. The phase P1 may be carried out by only once, or once more again after a phase P2, in which the switch S1 is turned on to pull the voltage V1 back to the ground voltage GND, and the voltage V2 will be maintained at the reference voltage VREF, in order to change the voltage V2 to discharge the capacitor Cint for a second time. If this process is repeated for many times, the voltage Vo will vary stepwise. In the final phase P3, the switch S5 is turned on for the measure unit 24 to measure the variation of the voltage Vo. Once the amount of charges drained from the capacitor Cint is known, the capacitance Cm can be calculated accordingly.

Figure 7:
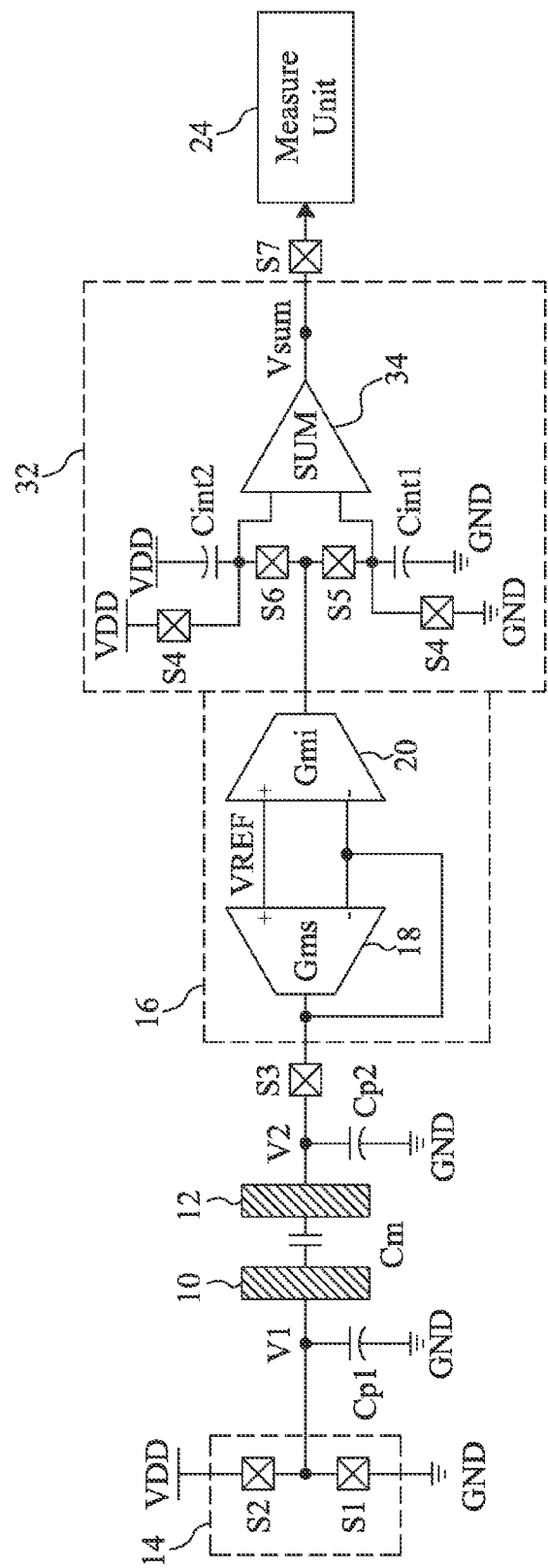
FIG. 7 is a circuit diagram of a fifth embodiment according to the present invention.
Figure 8:
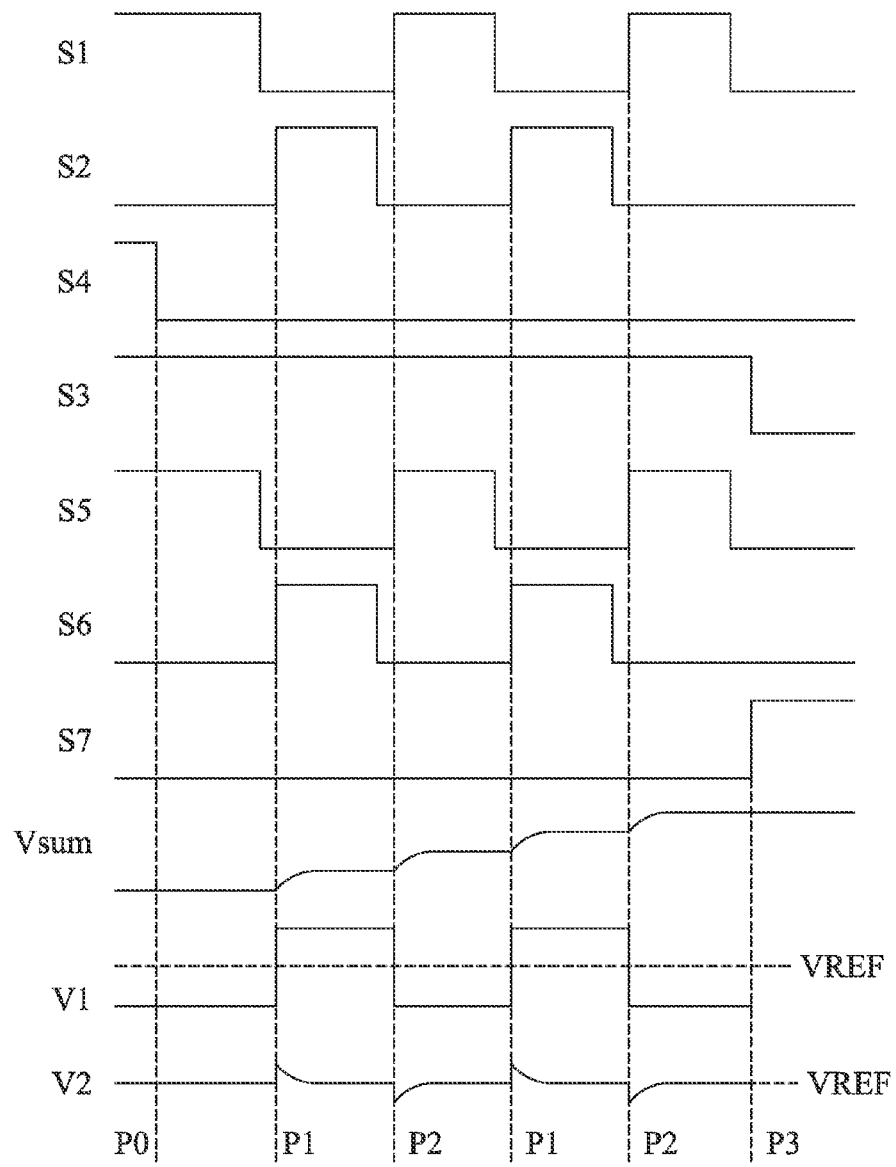
FIG. 8 is a timing diagram for the circuit depicted in FIG. 7.

FIG. 7 is a circuit diagram of a fifth embodiment according to the present invention, which is a combination of the embodiments shown in FIGS. 2 and 5, and FIG. 8 is a timing diagram for the circuit depicted in FIG. 7. In this embodiment, the switches S1 and S2 in the switching circuit 14 are controlled by two non-overlapping clocks to carry out the charging step of FIG. 2 and the discharging step of FIG. 5 in different phases, and then the charge amount variations are summed up to calculate the capacitance Cm. To start with, the switches S4 in the charge calculation circuit 32 are turned on in the phase P0 to initialize the capacitors Cint1 and Cint2, so that the voltage at the positive terminal of the capacitor Cint1 is set to the ground voltage GND, and the voltage at the positive terminal of the capacitor Cint2 is set to the supply voltage VDD. Meanwhile, the switch S3 is turned on to charge the electrode 12 so that the voltage V2 equals to the reference voltage VREF. In the subsequent phase P1, the switches S2 and S6 are turned on so that the voltage V1 of the electrode 10 is pulled high to the supply voltage VDD, causing the transconductance amplifier mirror circuit 16 to discharge the capacitor Cint2. In the phase P2 that follows, the switches S1 and S5 are turned on so that the voltage V1 of the electrode 10 is pulled down to the ground voltage GND, causing the transconductance amplifier mirror circuit 16 to charge the capacitor Cint1. Afterward, an analog adder 34 adds the terminal voltages of the capacitors Cint1 and Cint2 to produce a summed voltage Vsum, which is related to the capacitance Cm. In the final phase P3, the switch S7 is turned on for the downstream measure unit 24 to convert the summed voltage Vsum into a digital signal to calculate the capacitance Cm.

Figure 9:
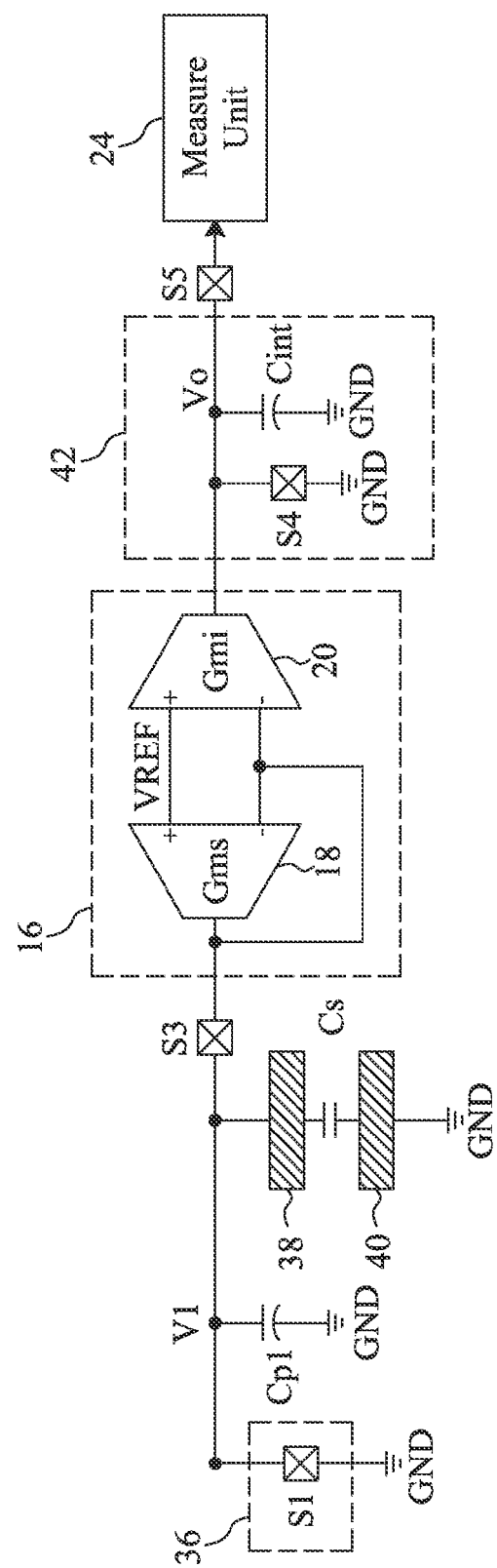
FIG. 9 is a circuit diagram of a sixth embodiment according to the present invention.

FIG. 9 is a circuit diagram of a sixth embodiment according to the present invention, for sensing the capacitance Cs of an electrode 38 with reference to ground GND, and as is well known, the ground GND can be regarded as a large grounded electrode 40 as shown in FIG. 9. In this embodiment, the circuit for sensing the capacitance Cs includes a switching circuit 36 and a charge calculation circuit 42, in addition to the transconductance amplifier mirror circuit 16 and the measure unit 24 as depicted in the above embodiments. The switching circuit 36 includes a switch S1 connected to the electrode 38, and when the switch S1 is on, the voltage V1 of the electrode 38 will be pulled down to a lower voltage level, for example, the ground voltage GND as shown in FIG. 9. A sensing switch S3 is connected between the electrode 38 and the transconductance amplifier mirror circuit 16, and when the switch S3 is on, the transconductance amplifier mirror circuit 16 may supply charges to the electrode 38 as illustrated by the embodiment of FIG. 1, thereby sustaining the voltage V1 at the reference voltage VREF, and responsive thereto, the transconductance amplifier mirror circuit 16 will supply a proportional amount of charges to the charge calculation circuit 42. The charge calculation circuit 42 includes a capacitor Cint and an initialization switch S4 shunt to each other between the output port of the transconductance amplifier 20 and the ground GND. The switch S4 is turned on prior to sensing the capacitance Cs, to initialize the voltage Vo of the capacitor Cint to the ground voltage GND. A switch S5 is connected between the charge calculation circuit 42 and the measure unit 24, and the measure unit 24 is configured for converting the voltage Vo of the capacitor Cint into a digital signal. Due to connections of hardware circuitry or wire routing on a PCB, there may be a parasitic capacitance Cp1 on the electrodes 38 that is not possessed by the electrode 38 itself, and the parasitic capacitance Cp1 may result in offset charges to hinder the sensing of the capacitance Cs. However, as the offset value caused by the parasitic capacitance Cp1 during the sensing of the capacitance Cs is a fixed value in this circuit, the measure unit 24 may deduct the offset value to minimize the influence of the parasitic capacitance Cp1 imparted on the sensitivity.

Figure 10:
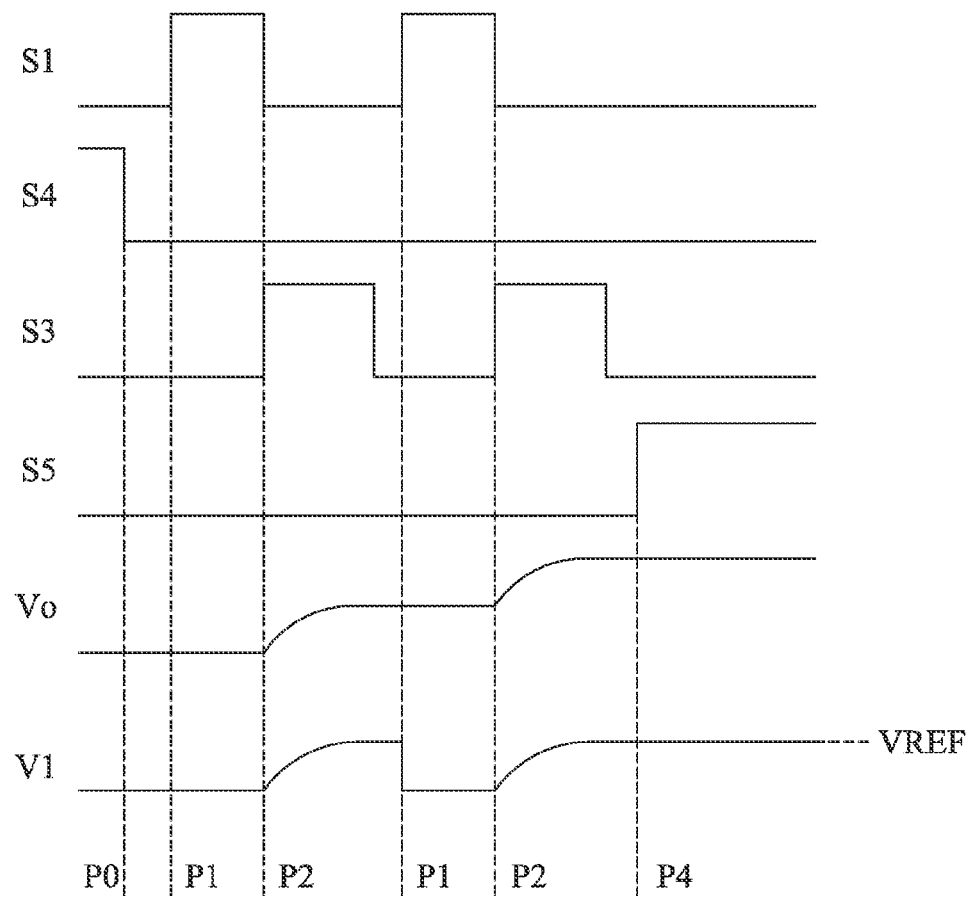
FIG. 10 is a timing diagram for the circuit depicted in FIG. 9.

FIG. 10 is a timing diagram for the circuit depicted in FIG. 9. In the initial phase P0, the switch S4 is turned on to initialize the voltage Vo of the capacitor Cint to the ground voltage GND. In the phase P1 that follows, the switch S1 is turned on to remove charges from the capacitor Cs, thereby pulling down the voltage V1 to the ground voltage GND. In the subsequent phase P2, the switch S1 is turned off and the switch S3 is turned on, so that the transconductance amplifier mirror circuit 16 will identify the voltage V1 is not equal to the reference voltage VREF, which causes the transconductance amplifier 18 to supply charges to the capacitor Cs, and thereby the transconductance amplifier 20 to supply a proportional amount of charges to the capacitor Cint. Charging the capacitor Cs from the ground voltage GND to the reference voltage VREF results in a charge amount variation $$Q=(VREF-GND) \times Cs.  \quad [\text{Eq-2}]$$

If the transconductance amplifiers 18 and 20 have a same transconductance, the amount of charges supplied to the capacitor Cint will be equal to the amount of charges Q calculated by the equation Eq-2. The phases P1 and P2 may be carried out by only once or repeated for many times. In the final phase P3, the switch S5 is turned on, and the measure unit 24 measures the variation of the voltage Vo to measure the amount of charges supplied from the transconductance amplifier mirror circuit 16 to the capacitor Cint, and subtracts the offset charges Qoff=(VREF−GND)×Cp1 caused by the parasitic capacitance Cp1 from the measured amount of charges to calculate the capacitance Cs.

Figure 11:
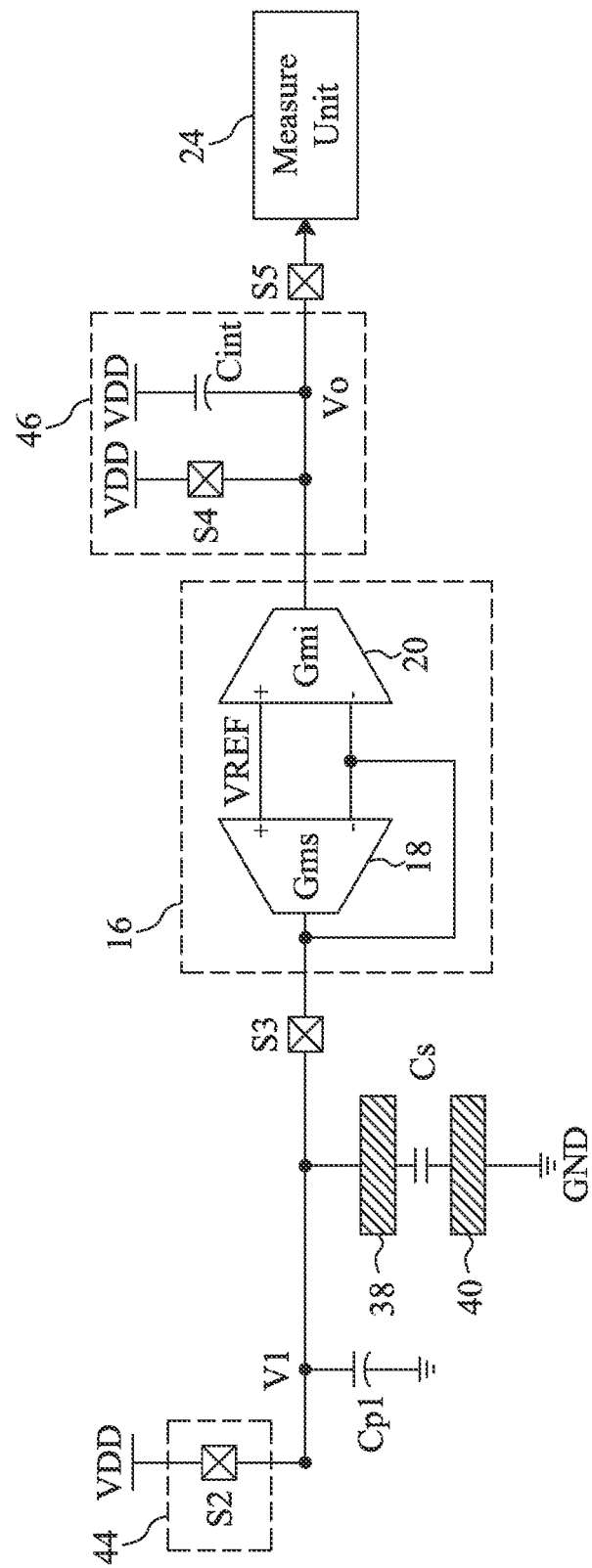
FIG. 11 is a circuit diagram of a seventh embodiment according to the present invention.

FIG. 11 is a circuit diagram of a seventh embodiment according to the present invention, which is similar to the embodiment of FIG. 9. A switching circuit 44 includes the switch S2 connected to the electrode 38, controlled to switch the voltage V1 of the electrode 38 to a higher voltage level, for example, the supply voltage VDD as shown in FIG. 11. The sensing switch S3 is connected between the electrode 38 and the transconductance amplifier mirror circuit 16, and when the switch S3 is on, the transconductance amplifier mirror circuit 16 may drain charges from the electrode 38 as illustrated by the embodiment of FIG. 4 to sustain the voltage V1 at the reference voltage VREF, and responsive thereto, the transconductance amplifier mirror circuit 16 will drain a proportional amount of charges from a charge calculation circuit 46. The charge calculation circuit 46 includes the capacitor Cint and the switch S4 shunt to each other between the output port of the transconductance amplifier 20 and the voltage source VDD. The initialization switch S4 will be turned on before sensing the capacitance Cs, to initialize the voltage Vo of the capacitor Cint to the supply voltage VDD. The switch S5 is connected between the charge calculation circuit 46 and the measure unit 24, and the measure unit 24 is configured for converting the voltage Vo of the capacitor Cint into a digital signal and deducting the offset value caused by the parasitic capacitance Cp1.

Figure 12:
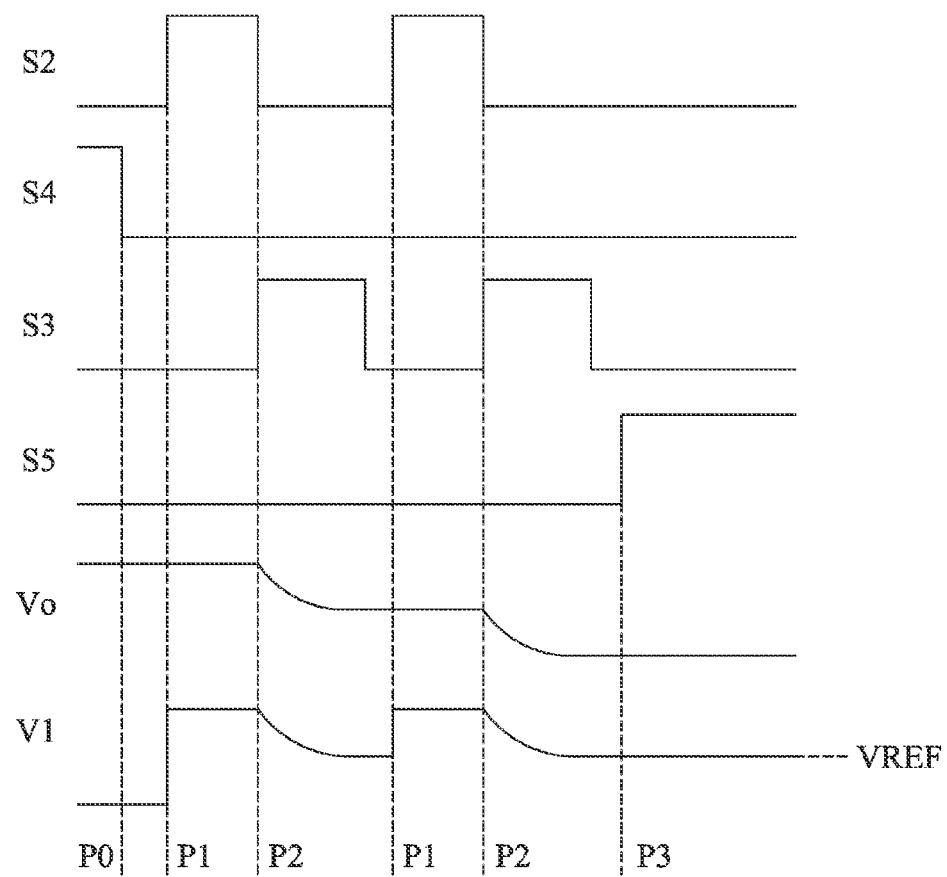
FIG. 12 is a timing diagram for the circuit depicted in FIG. 11.

FIG. 12 is a timing diagram for the circuit depicted in FIG. 11. In the starting phase P0, the switch S4 is turned on to initialize the voltage Vo of the capacitor Cint to the supply voltage VDD. In the phase P1 that follows, the switch S2 is turned on to pull high the voltage V1 of the capacitor Cs to the supply voltage VDD. Then, in the phase P2, the switch S2 is turned off and the switch S3 is turned on, so that the transconductance amplifier mirror circuit 16 will identify the voltage V1 is not equal to the reference voltage VREF, which will cause the transconductance amplifier 18 to drain charges from the capacitor Cs, and thereby the transconductance amplifier 20 to drain a proportional amount of charges from the capacitor Cint. Discharging the capacitor Cs from the supply voltage VDD to the reference voltage VREF results in a charge amount variation $$Q=(VREF-VDD)\times Cs. \quad [\text{Eq-3}]$$

If the transconductance amplifiers 18 and 20 have a same transconductance, the amount of charges that flow out from the capacitor Cint will be equal to the amount of charges Q calculated by the equation Eq-3. The phases P1 and P2 may be carried out by only once or repeated for many times. In the final phase P3, the switch S5 is turned on, and the downstream measure unit 24 measures the variation of the voltage Vo to measure the amount of charges drained from the capacitor Cint by the transconductance amplifier mirror circuit 16, and deducts the offset charges Qoff=(VREF−VDD)×Cp1 caused by the parasitic capacitance Cp1 to calculate the capacitance Cs.

Figure 13:
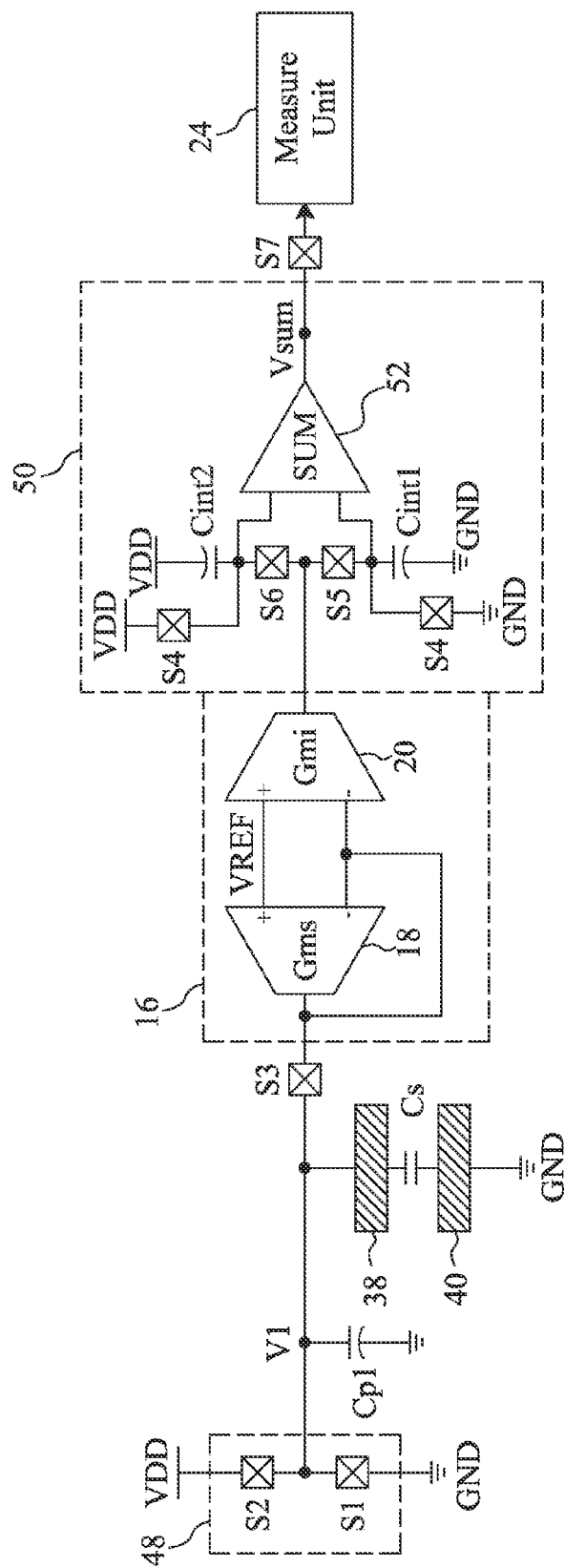
FIG. 13 is a circuit diagram of an eighth embodiment according to the present invention.
Figure 14:
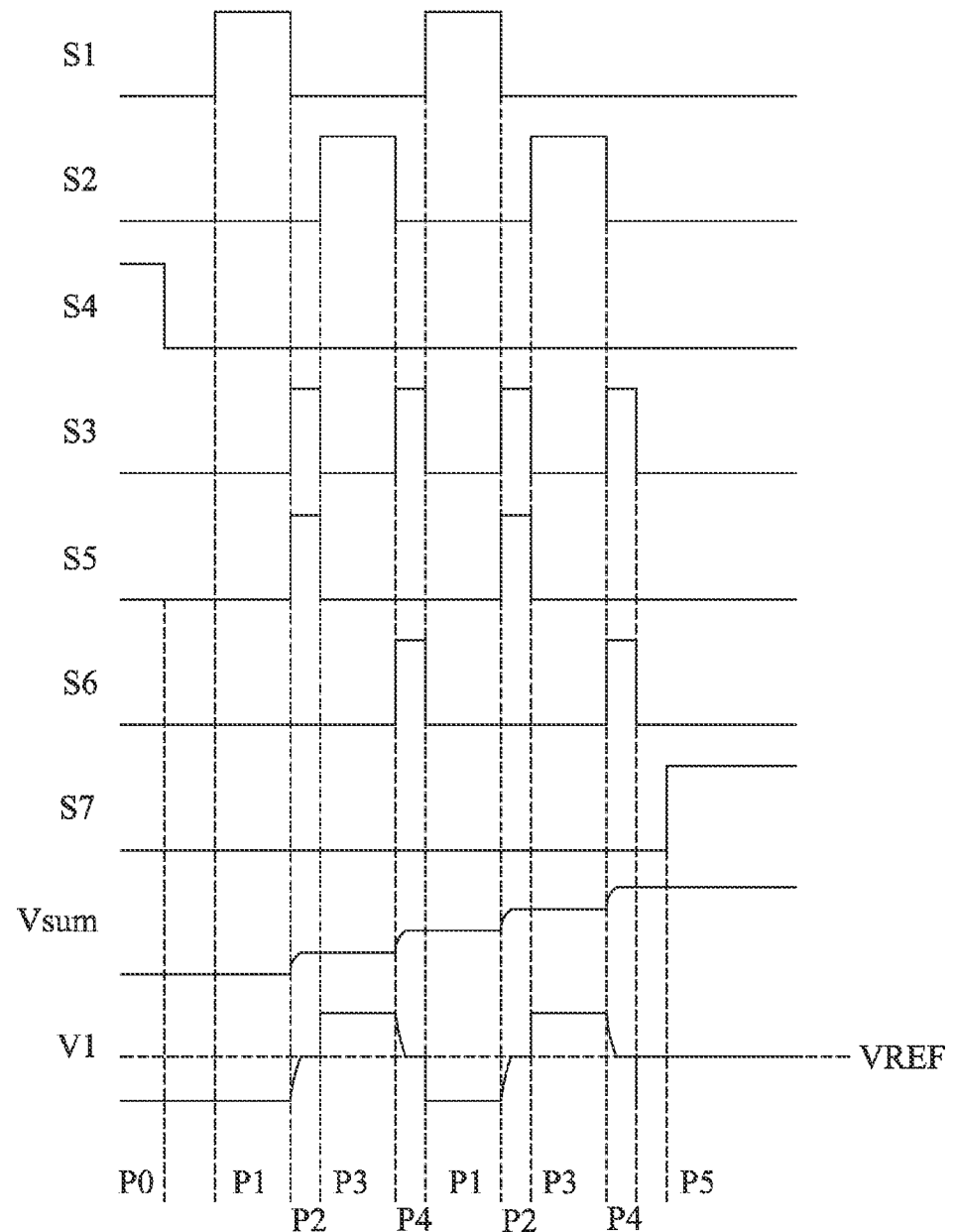
FIG. 14 is a timing diagram for the circuit depicted in FIG. 13.

FIG. 13 is a circuit diagram of an eighth embodiment according to the present invention, which is a combination of the embodiments depicted in FIGS. 9 and 11, and FIG. 14 is a timing diagram for the circuit depicted in FIG. 13. This embodiment controls the switches S1-S3 and S5-S6 to carry out the charging step of FIG. 9 and the discharging step of FIG. 11 in different phases, and sums up the charge amount variations to calculate the capacitance Cs. In the starting phase P0, the switches S4 in the charge calculation circuit 50 are turned on to initialize the capacitors Cint1 and Cint2, so that the voltage at the positive terminal of the capacitor Cint1 is set to the ground voltage GND, and the voltage at the positive terminal of the capacitor Cint2 is set to the supply voltage VDD. In the following phase P1, the switch S1 is turned on to pull down the voltage V1 of the capacitor Cs to the ground voltage GND. In the subsequent phase P2, the switches S3 and S5 are turned on so that the transconductance amplifier mirror circuit 16 will charge the capacitors Cs and Cint1 simultaneously. Then, the switch S2 is turned on in the phase P3 to pull high the voltage V1 of the capacitor Cs to the supply voltage VDD. In the phase P4 that follows, the switches S3 and S6 are turned on so that the transconductance amplifier mirror circuit 16 will discharge the capacitors Cs and Cint2 simultaneously. Afterward, an analog adder 52 sums up the terminal voltages of the capacitors Cint1 and Cint2 to produce a summed voltage Vsum. In the final phase P5, the switch S7 is turned on for the downstream measure unit 24 to measure the summed voltage Vsum to calculate the capacitance Cs.

Figure 15:
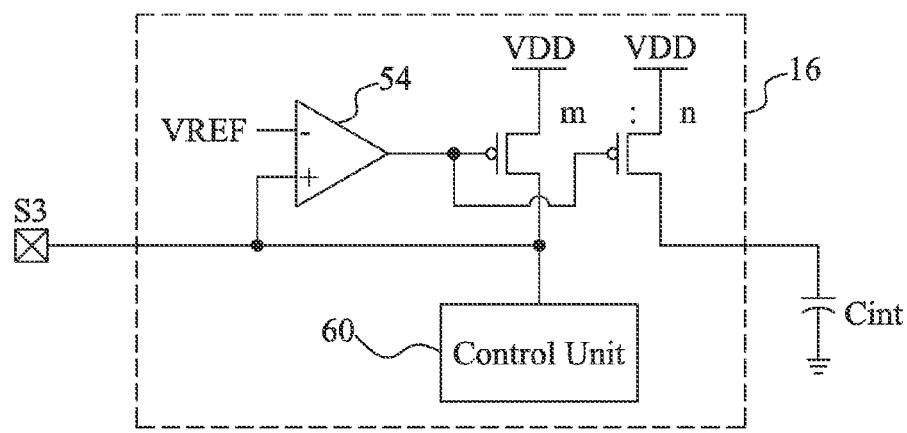
FIG. 15 is a circuit diagram of a first embodiment for the transconductance amplifier mirror circuit in some embodiments of the present invention.
Figure 16:
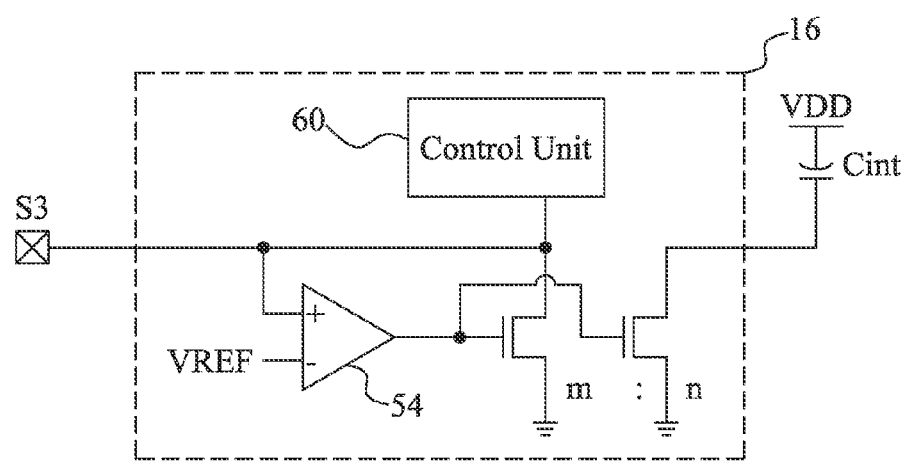
FIG. 16 is a circuit diagram of a second embodiment for the transconductance amplifier mirror circuit in some embodiments of the present invention.
Figure 17:
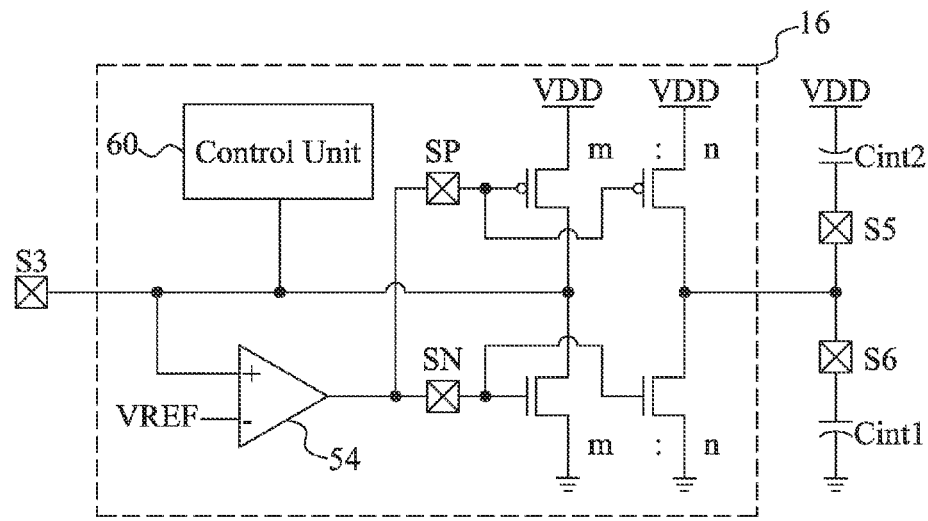
FIG. 17 is a circuit diagram of a third embodiment for the transconductance amplifier mirror circuit by combining the circuits depicted in FIGS. 15 and 16.
Figure 18:
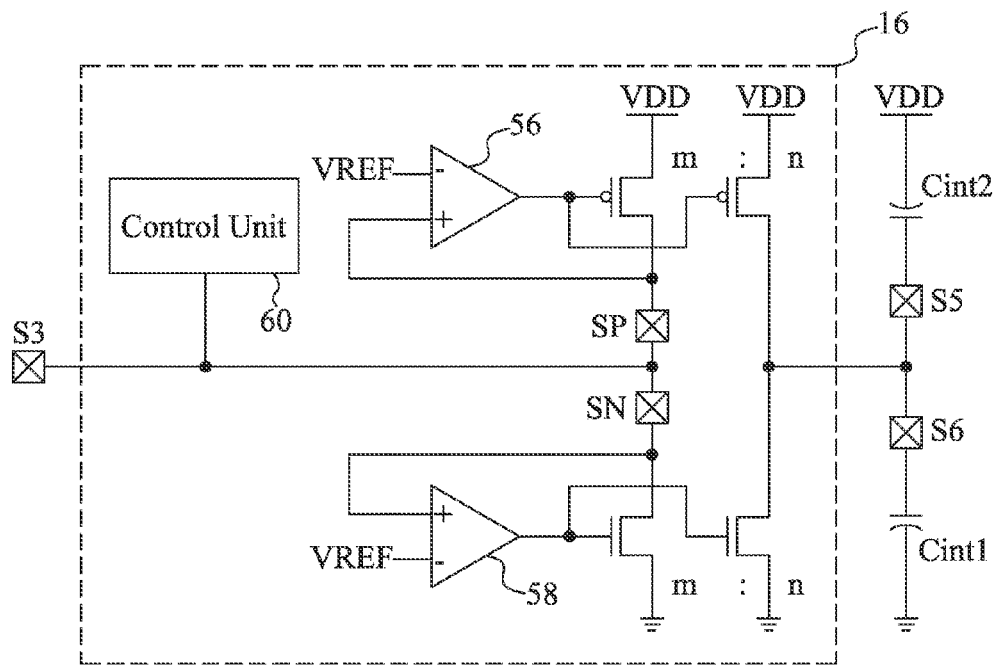
FIG. 18 is a circuit diagram of a fourth embodiment for the transconductance amplifier mirror circuit by combining the circuits depicted in FIGS. 15 and 16.

In the foregoing embodiments, the transconductance amplifier mirror circuit 16 is implemented by two independent transconductance amplifiers 18 and 20 in a common input configuration. However, in order to prevent two independent transconductance amplifiers from being affected by offset voltage effect caused by the manufacturing process thereof, it is feasible to implement the transconductance amplifier mirror circuit 16 by sharing a common input stage. For example, as shown in FIG. 15, a transconductance amplifier mirror circuit 16 includes a comparator 54 as its input stage to compare the voltage V2 of the electrode 12 (or the voltage V1 of the electrode 38) with the reference voltage VREF to generate an error signal to control two PMOS transistors having a size ratio of m:n. The comparator 54 and the size-m PMOS transistor establish a transconductance amplifier having a transconductance Gms, and the comparator 54 and the size-n PMOS transistor establish a transconductance amplifier having a transconductance Gmi. The transconductance amplifier mirror circuit 16 of FIG. 15 is applicable to the embodiments that are only required to charge the capacitor Cint, such as those depicted in FIGS. 1, 2, and 9. In another embodiment as shown in FIG. 16, a transconductance amplifier mirror circuit 16 includes a comparator 54 to generate an error signal to control two NMOS transistors having a size ratio of m:n, in which the comparator 54 and the size-m NMOS transistor establish a transconductance amplifier having a transconductance Gms, and the comparator 54 and the size-n NMOS transistor establish a transconductance amplifier having a transconductance Gmi. This transconductance amplifier mirror circuit 16 is suitable for the embodiments that are only required to discharge the capacitor Cint, such as those depicted in FIGS. 4, 5, and 11. FIG. 17 is a circuit diagram of a balanced type transconductance amplifier mirror circuit incorporating the PMOS transistors of FIG. 15 and the NMOS transistors of FIG. 16, in which a switch SP controls to operate with the PMOS transistors, and a switch SN controls to operate with the NMOS transistors. Alternatively, as shown in FIG. 18, two comparators 56 and 58 are used for controlling the charging process of the PMOS transistors and the discharging process of the NMOS transistors, respectively. In an embodiment, the comparators 56 and 58 of FIG. 18 have different reference voltages VREF in order to increase the voltage variation during the charging or discharging process and thereby increase the amount of charges to be calculated and hence the sensitivity. The embodiments of FIGS. 17 and 18 are applicable to the embodiments that are required to charge and discharge the capacitor Cint, such as those depicted in FIGS. 7 and 13. Each of the comparators 54, 56, and 58 may be implemented by an operational amplifier, an operational transconductance amplifier, or an error amplifier. The control unit 60 shown in FIGS. 15-18 is needed only when the capacitance Cm is measured, as in the embodiments of FIGS. 1, 2, 4, 5 and 7, for the purpose of keeping the voltage V2 of the electrode 12 at the reference voltage VREF before the switches in the switching circuit 14 are switched, so that not only is the voltage V2 prevented from being offset and hence compromising the accuracy of the sensing result while the electrode 12 is charged or discharged, but also circuit stability in a noisy operation environment is ensured. As the aforesaid problems do not exist in the embodiments of FIGS. 9, 11, and 13 where it is the capacitance Cs to be sensed, the control unit 60 is not required in such embodiments.

Figure 19:
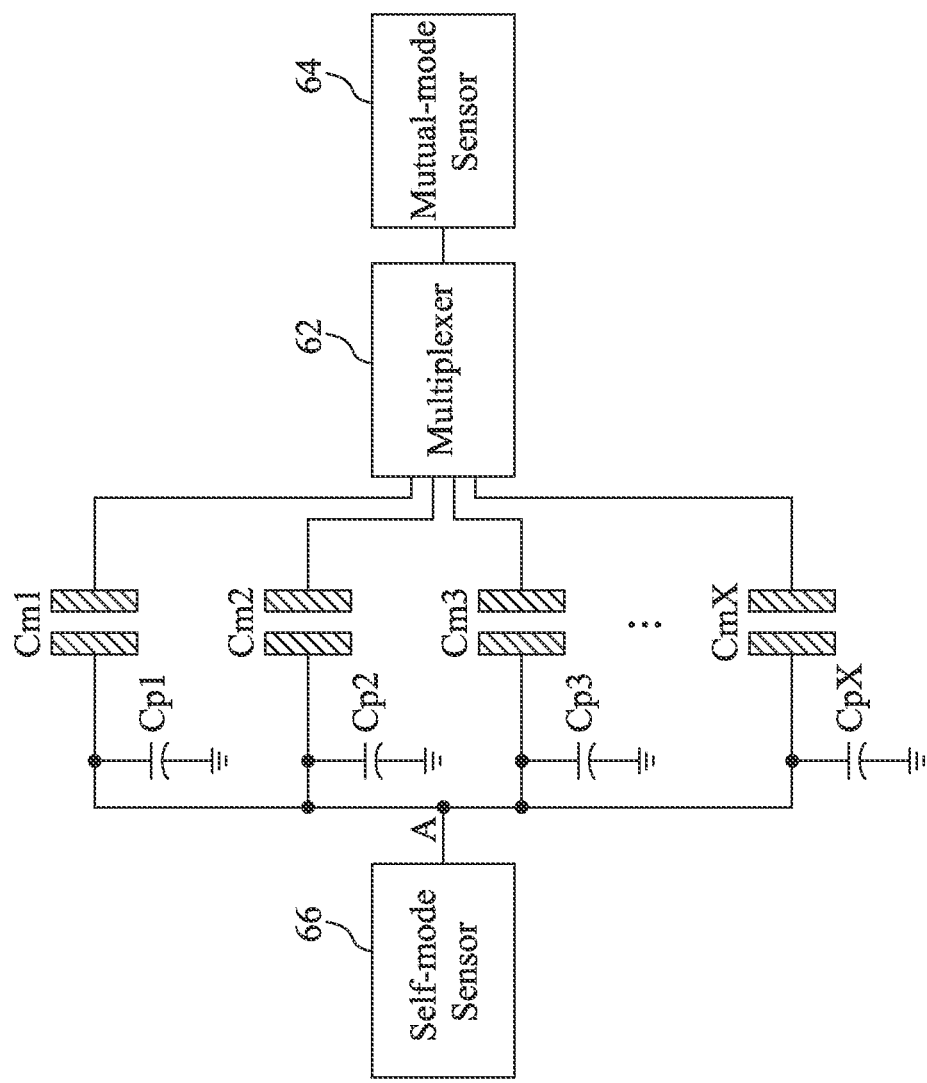
FIG. 19 is an embodiment for applications of the present invention to a capacitive touch panel.

A capacitive touch panel includes a plurality of electrodes and a protective layer for protecting the electrodes, in which each of the electrodes has a self capacitance with reference to ground, and the electric lines between the electrodes give rise to mutual capacitance. When an electrical conductor, e.g. a human finger, approaches a capacitive touch panel, the self capacitance of the electrode being approached increases, but the mutual capacitance between the electrode being approached and the neighboring electrodes decreases. The sensing methods illustrated by the embodiments of FIGS. 1, 2, 4, 5 and 7 are suitable for sensing the mutual capacitance between the electrodes of a capacitive touch panel, and the sensing methods illustrated by the embodiments of FIGS. 9, 11 and 13 are suitable for sensing the self capacitance of each electrode of a capacitive touch panel. FIG. 19 is an embodiment for applications of the present invention to a capacitive touch panel, using the transconductance amplifier mirror circuit 16 to operate with a mixed mode sensing to the self capacitance and the mutual capacitance of the electrodes of the capacitive touch panel. In FIG. 19, each capacitance of the capacitor array Cm1, Cm2, Cm3, . . . , CmX represents a mutual capacitance established between two electrodes, and each of the capacitors Cm1, Cm2, Cm3, . . . , CmX has one of its electrodes connected to a common terminal A, and the other electrode individually connected to a multiplexer 62 having X input ports. Depending on the different sensing methods, the sensing circuits of the present invention may be identified as two separate blocks, a mutual mode sensor 64 and a self mode sensor 66. The multiplexer 62 is connected to the mutual mode sensor 64, and the common terminal A is connected to the self mode sensor 66. Cp1, Cp2, Cp3, . . . , CpX denote the parasitic capacitances with reference to ground at the common terminal A on the capacitors Cm1, Cm2, Cm3, . . . , CmX, respectively. In the PCB routing, the capacitance of the common terminal A with reference to ground is established by the capacitances Cp1, Cp2, Cp3, . . . , CpX, which jointly form what appears to be a large area electrode. The self mode sensor 66 can sense the self capacitance of this large area electrode for proximity sensing. Then, by the switching of the multiplexer 62, the mutual mode sensor 64 can sense each mutual capacitance Cm1, Cm2, Cm3, . . . , CmX for location sensing.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for sensing a capacitance of an electrode with reference to ground, comprising:
   a switching circuit connected to the electrode, controlled to change a voltage level of the electrode;
   a transconductance amplifier mirror circuit including a first output port and a second output port, operative to maintain a voltage level of the first output port at a reference voltage;
   a sensing switch connected between the electrode and the first output port of the transconductance amplifier mirror circuit, controlled to connect the first output port to the electrode, wherein when the voltage level of the electrode is lower than the reference voltage and the sensing switch is turned on, the transconductance amplifier mirror circuit supplies a first amount of charges to the first output port and a second amount of charges to the second output port responsive to a difference between the voltage level of the electrode and the reference voltage; and
   a charge calculation circuit connected to the second output port of the transconductance amplifier mirror circuit, operative to generate a sensed signal responsive to the second amount of charges;
   wherein the second amount of charges is proportional to the first amount of charges.

2. The circuit of claim 1, wherein the switching circuit comprises a switch controlled to switch the voltage level of the electrode to a lower voltage level lower than the reference voltage.

3. The circuit of claim 2, wherein the transconductance amplifier mirror circuit comprises:
   a first transconductance amplifier connected to the first output port of the transconductance amplifier mirror circuit, operative to supply the first amount of charges to the first output port responsive to the difference between the voltage level of the electrode and the reference voltage; and
   a second transconductance amplifier connected to the first transconductance amplifier and the second output port of the transconductance amplifier mirror circuit, operative to supply the second amount of charges to the second output port.

4. The circuit of claim 3, wherein the charge calculation circuit comprises:
   a capacitor connected to the second output port of the transconductance amplifier mirror circuit, responsive to the second amount of charges to generate the sensed signal; and
   an initialization switch connected to the capacitor, controlled to initialize a voltage level of the capacitor to the lower voltage level.

5. The circuit of claim 2, wherein the transconductance amplifier mirror circuit comprises:
   a comparator connected to the first output port of the transconductance amplifier mirror circuit, comparing the voltage level of the electrode with the reference voltage to generate an error signal;

a first PMOS transistor connected to the comparator and the first output port of the transconductance amplifier mirror circuit, controlled by the error signal to supply the first amount of charges to the first output port; and a second PMOS transistor connected to the comparator and the second output port of the transconductance amplifier mirror circuit, controlled by the error signal to supply the second amount of charges to the second output port.

6. The circuit of claim 5, wherein the comparator comprises an operational amplifier, an operational transconductance amplifier, or an error amplifier.

7. The circuit of claim 5, wherein the charge calculation circuit comprises:

a capacitor connected to the second output port of the transconductance amplifier mirror circuit, responsive to the second amount of charges to generate the sensed signal; and an initialization switch connected to the capacitor, controlled to initialize a voltage level of the capacitor to the lower voltage level.

8. A circuit for sensing a capacitance of an electrode with reference to ground, comprising:

a switching circuit connected to the electrode, controlled to change a voltage level of the electrode;

a transconductance amplifier mirror circuit including a first output port and a second output port, operative to maintain a voltage level of the first output port at a reference voltage;

a sensing switch connected between the electrode and the first output port of the transconductance amplifier mirror circuit, controlled to connect the first output port to the electrode, wherein when the voltage level of the electrode is higher than the reference voltage and the sensing switch is turned on, the transconductance amplifier mirror circuit drains a first amount of charges from the first output port and a second amount of charges from the second output port responsive to a difference between the voltage level of the electrode and the reference voltage; and a charge calculation circuit connected to the second output port of the transconductance amplifier mirror circuit, operative to generate a sensed signal responsive to the second amount of charges;

wherein the second amount of charges is proportional to the first amount of charges.

9. The circuit of claim 8, wherein the switching circuit comprises a switch controlled to switch the voltage level of the electrode to a higher voltage level higher than the reference voltage.

10. The circuit of claim 9, wherein the transconductance amplifier mirror circuit comprises:

a first transconductance amplifier connected to the first output port of the transconductance amplifier mirror circuit, operative to drain the first amount of charges from the first output port responsive to the difference between the voltage level of the electrode and the reference voltage; and a second transconductance amplifier connected to the first transconductance amplifier and the second output port of the transconductance amplifier mirror circuit, operative to drain the second amount of charges from the second output port.

11. The circuit of claim 10, wherein the charge calculation circuit comprises:

a capacitor connected to the second output port of the transconductance amplifier mirror circuit, responsive to the second amount of charges to generate the sensed signal; and an initialization switch connected to the capacitor, controlled to initialize a voltage level of the capacitor to the higher voltage level.

12. The circuit of claim 9, wherein the transconductance amplifier mirror circuit comprises:

a comparator connected to the first output port of the transconductance amplifier mirror circuit, comparing the voltage level of the electrode with the reference voltage to generate an error signal;

a first NMOS transistor connected to the comparator and the first output port of the transconductance amplifier mirror circuit, controlled by the error signal to drain the first amount of charges from the first output port; and a second NMOS transistor connected to the comparator and the second output port of the transconductance amplifier mirror circuit, controlled by the error signal to drain the second amount of charges from the second output port.

13. The circuit of claim 12, wherein the comparator comprises an operational amplifier, an operational transconductance amplifier, or an error amplifier.

14. The circuit of claim 12, wherein the charge calculation circuit comprises:

a capacitor connected to the second output port of the transconductance amplifier mirror circuit, responsive to the second amount of charges to generate the sensed signal; and an initialization switch connected to the capacitor, controlled to initialize a voltage level of the capacitor to the higher voltage level.

* * * * *